United States Patent [19]

Drexler et al.

[11] 4,284,716
[45] * Aug. 18, 1981

[54] BROADBAND REFLECTIVE LASER RECORDING AND DATA STORAGE MEDIUM WITH ABSORPTIVE UNDERLAYER

[75] Inventors: Jerome Drexler, Los Altos Hills; Eric W. Bouldin, Woodside, both of Calif.

[73] Assignee: Drexler Technology Corporation, Mountain View, Calif.

[*] Notice: The portion of the term of this patent subsequent to May 26, 1998, has been disclaimed.

[21] Appl. No.: 140,136

[22] Filed: Apr. 14, 1980

Related U.S. Application Data

[63] Continuation-in-part of Ser. No. 55,270, Jul. 6, 1979, and a continuation-in-part of Ser. No. 121,732, Feb. 15, 1980, abandoned.

[51] Int. Cl.³ .................... G03C 1/84; G03C 1/76; G02B 27/22; G03C 5/24
[52] U.S. Cl. ........................... 430/510; 430/16; 430/414; 430/416; 430/523; 430/539; 430/616; 430/964
[58] Field of Search .............. 430/616, 16, 346, 246, 430/416, 414, 231, 229, 964, 945, 523, 539, 510; 346/76 L, 135.1

[56] References Cited

U.S. PATENT DOCUMENTS

| | | | |
|---|---|---|---|
| 2,500,421 | 3/1950 | Land | 430/208 |
| 3,179,517 | 4/1965 | Tregillus et al. | 430/206 |
| 3,253,923 | 5/1966 | Glover et al. | 430/414 |
| 3,314,073 | 4/1967 | Becker | 346/76 L |
| 3,464,822 | 9/1969 | Blake | 430/311 |
| 3,578,450 | 5/1971 | Miller et al. | 430/246 |
| 3,689,894 | 9/1972 | Laura et al. | 340/172.5 |
| 3,705,804 | 12/1972 | Farney et al. | 430/246 |
| 3,889,272 | 6/1975 | Lou et al. | 346/135.1 |
| 3,893,129 | 7/1975 | Endo et al. | 346/76 L |
| 3,911,444 | 10/1975 | Lou | 340/346 |
| 4,139,853 | 2/1979 | Ghekiere et al. | 346/76 L |

OTHER PUBLICATIONS

Bartolini et al., "Review and . . . Recording Media", *Optical Engrg.*, vol. 15, No. 2, Mar./Apr. 1976, p. 99.
L. P. Clerc, *Photography Theory and Practice*, vol. 3, Am. Photo. Book Pub. Co., New York, 1970, p. 325.

*Primary Examiner*—Richard L. Schilling

[57] ABSTRACT

A broadband laser recording and data storage medium for direct read after writing, formed from a photosensitive silver-halide emulsion in four steps. First, a nonsaturating actinic radiation exposure is used to create latent images. A normal photographic development is used to produce a medium of gray neutral density. The surface of the remaining silver halide is fogged in a water or alcohol based solution to create a very thin layer of silver precipitating nuclei on the surface. Finally, a single-step, negative silver diffusion transfer process is used to dissolve the unexposed and undeveloped silver halide, forming silver ion complexes. These complexes are transported by diffusion transfer to the sites of the silver precipitating nuclei and the filamentary silver on the surface, where the silver complexes are reduced to metallic silver on both the nuclei and the filamentary silver to form a high concentration of non-filamentary silver particles at the surface of a low melting temperature colloid matrix which is highly reflective of light and electrically non-conducting.

8 Claims, 9 Drawing Figures

NEGATIVE DIFFUSION TRANSFER FROM EMULSION LAYER TO THE NUCLEI.

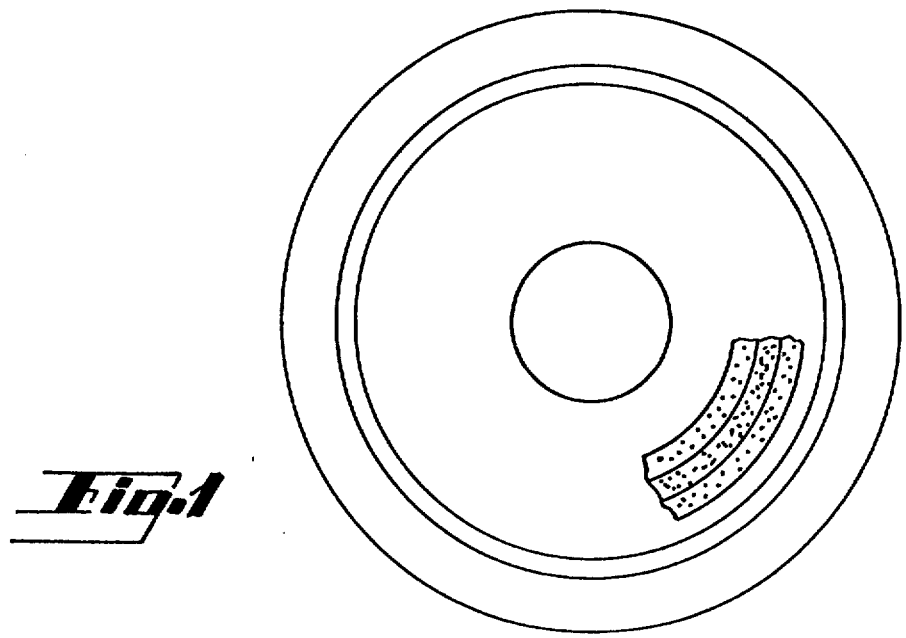
Fig. 1
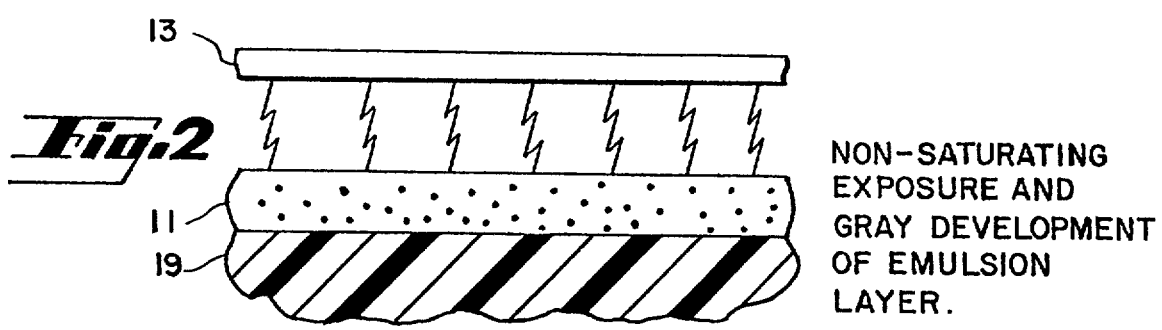
Fig. 2 — NON-SATURATING EXPOSURE AND GRAY DEVELOPMENT OF EMULSION LAYER.
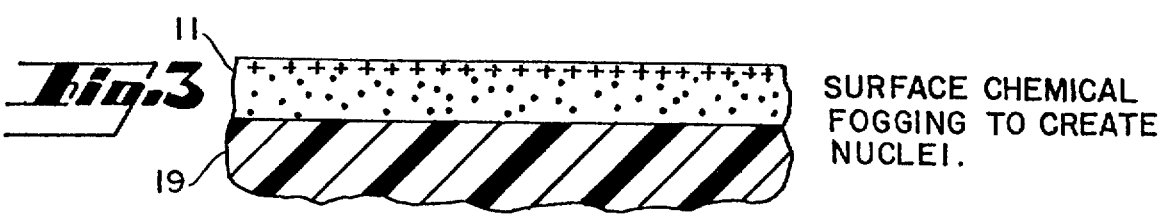
Fig. 3 — SURFACE CHEMICAL FOGGING TO CREATE NUCLEI.
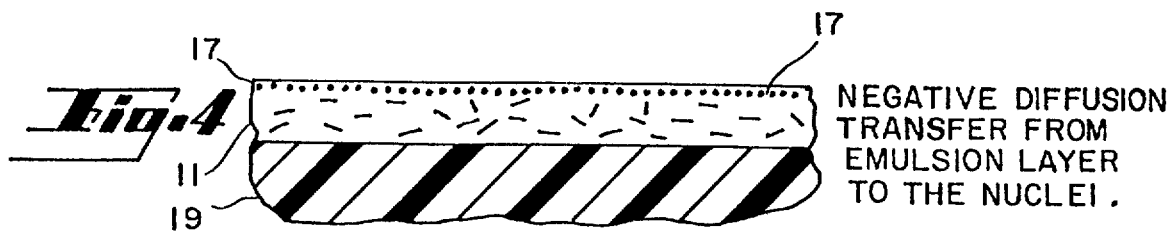
Fig. 4 — NEGATIVE DIFFUSION TRANSFER FROM EMULSION LAYER TO THE NUCLEI.

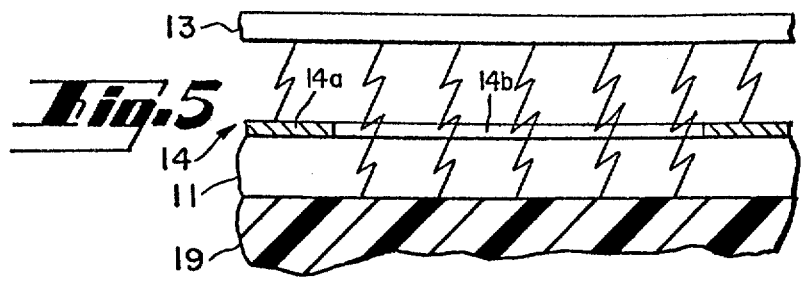
MASK, THEN FIRST NON-SATURATING EXPOSURE OF THE EMULSION.
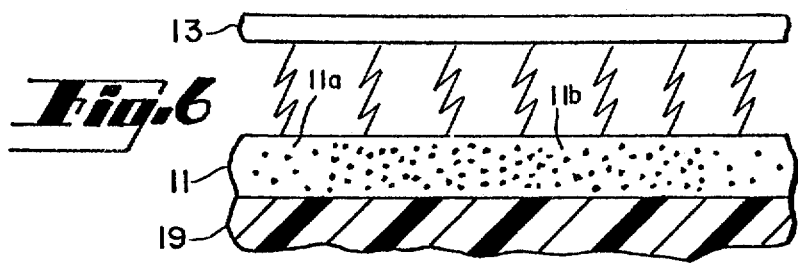
SECOND NON-SATURATING EXPOSURE AND THEN GRAY DEVELOPMENT.
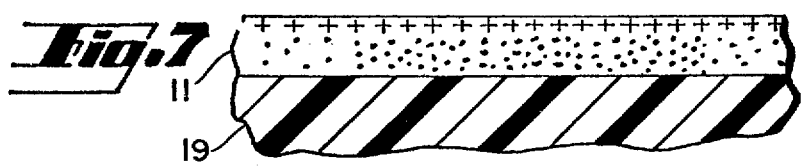
SURFACE CHEMICAL FOGGING TO CREATE NUCLEI.
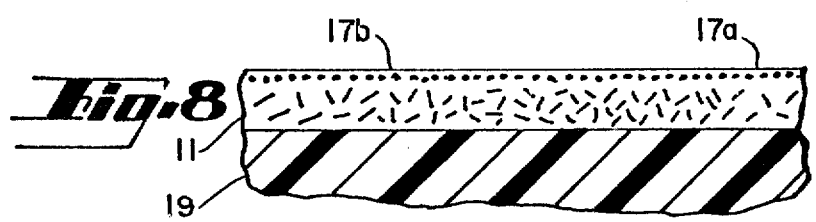
NEGATIVE DIFFUSION TRANSFER FROM EMULSION LAYER TO THE NUCLEI.
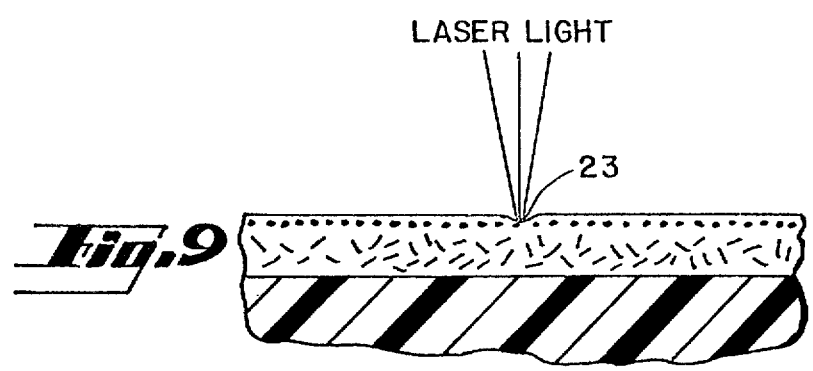

BROADBAND REFLECTIVE LASER RECORDING AND DATA STORAGE MEDIUM WITH ABSORPTIVE UNDERLAYER

CROSS REFERENCE TO RELATED APPLICATION

This is a continuation-in-part of application Ser. No. 55,270, filed July 6, 1979 and a continuation-in-part of application Ser. No. 121,732 filed Feb. 15, 1980, now abandoned. Application Ser. No. 55,270 is the parent of the following divisional application Ser. Nos. 161,342, 168,334, 168,335 and 172,215.

BACKGROUND OF THE INVENTION a. Field of the Invention

The invention relates to laser recording media, and more particularly to a broadband reflective silver data recording and storage medium.

b. Prior Art

Previously, many types of optical recording media have been developed for laser writing. For example, an article in Optical Engineering, Vol. 15, No. 2, March-April 1976, p. 99 discusses properties of a large number of media. Some of these media require post write processing before they can be read, and some can be read immediately after laser writing. The media of interest herein are for "direct read after write" capability, commonly known as "DRAW" media. Presently known laser DRAW media are thin metal films in which holes may be melted, composite shiny films whose reflectivity at a spot may be reduced by evaporation, thin films of dyes or other coatings which can be ablated at a spot, and dielectric materials whose refractive-index may be changed at a point, causing a scattering of light when scanned with a read laser.

The most common DRAW media are thin metal films, usually on a glass substrate. Thin metal films have several advantages: First, they can be produced for research purposes in small quantities with commercially available sputtering equipment. Second, they can be read either by reflection or by transmission. Third, films of tellurium and bismuth have relatively high recording sensitivies.

Attempts have been made to improve the laser recording sensitivity of various types of reflective electrically conducting metal layers. In U.S. Pat. No. 3,911,444 Lou, Watson and Willens disclose a vacuum-deposited metal film recording media for laser writing incorporating a separately deposited plastic film undercoat between the metal film and a flexible transparent substrate to thermally insulate the metal layer in order to require less energy to write with a laser.

In U.S. Pat. No. 3,314,073 Becker discloses a data recording and storage system which consists of laser recording on a dark vaporizable film. This film is to be made as absorptive as possible with as little reflectivity as possible. In U.S. Pat. No. 3,893,129 Endo discloses a laser recording system which records on exposed and developed microfilm. In U.S. Pat. No. 3,689,894 Laura and Eng disclose an image storage and retrieval system. This system records data on developed microfilm by optically writing transparent bits in black areas of the microfilm. This is accomplished by burning holes through the black developed microfilm.

N. V. Philips of The Netherlands and Hitachi of Japan have announced a pre-recording or pre-grooving method using tellurium. Before sputtering the tellurium coating the plastic substrate is molded with $\frac{1}{4}$ wavelength depressions at the wavelength of the laser to be used to create regions of altered phase shift of the reflected light, thereby creating tracks that can be followed with an optical servo.

These thin metal films have enabled a large amount of research to be conducted and progress to be made in the design of optical data storage systems. To date, tellurium and amorphous mixtures thereof have evolved as the most widely used of the metal films. However, tellurium must be manufactured by an expensive, batch-type, vacuum sputtering technique; it does not form a tenacious coating; and it introduces manufacturing and environmental complications because of its toxicity and since it rapidly oxidizes in air it must be encapsulated in an airtight system in order for it to achieve an acceptable archival life.

What is particularly desirable about tellurium is that it has a low melting temperature for a metal, 450° C., and also a very low thermal conductivity of 2.4 watts per meter per degree Kelvin at 573° K. For example, in comparison, silver metal has a melting temperature of 960° C. and a thermal conductivity of 407 watts per meter per degree Kelvin at the same elevated temperature. When thin, electrically conductive films of these two metals are compared for laser recording with short pulses of laser power, the tellurium is far superior from a recording sensitivity standpoint since the low thermal conductivity keeps the heat generated by the laser beam confined to a small area and the lower melting temperature facilitates the melting of the hole.

The use of an electrically conducting, continuous metal film of silver as a reflective laser recording medium would be impractical for precisely the same reasons that tellurium has been adopted. That is, silver melts at more than twice the temperature and has a thermal conductivity about 170 times higher. Despite these apparent disadvantages, non-filamentary silver can be used quite effectively if it is dispersed throughout a dielectric such as gelatin with a sufficiently high volume concentration to create a reflective surface but low enough in volume concentration that the silver layer is not continuous. Under these special circumstances the laser beam need only melt the dielectric to record data on the reflective surface, not the silver itself.

A reflective silver laser recording medium of this general type was the subject of a prior application Ser. No. 012,235 by J. Drexler. In that application a processed black filamentary silver emulsion was converted to a reflective non-electrically conductive reflective recording medium by heating at a temperature in the range of 250° C. to 330° C. in an oxygen containing atmosphere until the surface developed a shiny reflective appearance. This laser recording material worked effectively with laser beams of visible wavelength but its recording sensitivity fell by about a factor of three for semiconductor lasers, which generate light beams in the near infrared at about 830 nm. Also the high temperature heating process precluded the possibility of using plastic film substrates commonly used for photographic films and other plastics.

In patent application Ser. No. 055,270 E. W. Bouldin and J. Drexler described a reflective data storage medium derived from silver-halide emulsion and using a silver diffusion transfer process. No heating was required to create the reflective surface; reflectivities up to 24.4% to green light were achieved. However, the recording sensitivity of this material was less than that of the process described in application Ser. No. 012,235, which yielded reflectivities up to 17.2%.

In patent application Ser. No. 072,908 by J. Drexler and E. W. Bouldin, a medium was disclosed in which the recording sensitivity was greatly improved over that described in application Ser. No. 055,270 and even somewhat higher than that achieved in the medium described in application Ser. No. 012,235. However it was necessary to add an annealing step at a temperature at 250° C. and above to achieve the desired results. Also, although the recording sensitivity was very good with a green laser beam at 514 nanometers and with a red laser beam at 633 nonometers, it fell off by about a factor of three when the laser wavelength was increased to 830 nanometers. This effect was similar to that observed with materials produced by the method of patent application Ser. No. 012,235. By the method of patent application Ser. No. 072,908 the best sensitivities were achieved with media having reflectivities in the green of 25.5% although reflectivities up to 36.6% were observed from less sensitive samples.

These last three referenced co-pending patent applications described a reflective data storage or laser recorcing media produced from silver-halide emulsions so as to create the desired reflective but non-electrically conducting surface desired for efficient laser recording. These photographic materials have the added advantage that photographic-type techniques can be used for either replicating master discs or pre-recording data or control markings on the reflective surface. However, these media were limited in recording sensitivity in the long wavelengths near 830 nanometers, and in achieving high reflectivity along with high sensitivity and in requiring a relatively high temperature process to be used for high sensitivity DRAW recording applications, which limited the selection of plastics that could be used as substrates.

An object of the invention was to devise a non-toxic, highly sensitive reflective DRAW laser recording and data storage medium which may be manufactured without the use of a vacuum system and on a continuous basis and which may be used to record low-reflectivity spots in a reflective field with relatively low energy laser pulses. Another object was to achieve at the long red wavelength and near-infrared wavelengths, recording sensitivities similar to what have been achieved by the recording media described in co-pending patent applications Ser. No. 012,235 and Ser. No. 072,908 in the visible. Another object was to devise a manufacturing process which would permit the use of a wider variety of plastic substrates. Another object was to achieve higher reflective surfaces without lowering the recording sensitivity so as to increase the reflective light to facilitate automatic focusing and increase the signal level when data is read.

SUMMARY OF THE INVENTION

The above objects have been met with the discovery that the silver halide in a photosensitive emulsion of a photoplate or film may be exposed and developed into two optically contrasting layers by a series of steps so as to create a laser recording medium that is absorptive to laser beams both in the visible and near infrared. A partially transmissive mirror-like reflective upper layer is formed atop an absorptive underlayer, both of which absorb light energy in the ultraviolet, visible and infrared spectra.

This two-layer medium absorbs and dissipates the heat of laser beams impinging either in the visible wavelength or near infrared, making this laser recording medium very broadband to the wavelength of the recording laser. The reading of the data on the reflective surface is also broadband. Further, the reflective surface may contain pre-recorded data by patterning with lower or higher reflectivity markings by means of a photographic exposure through a photomask. This pre-recorded data is also broadband in that it can be read with a visible or near-infrared laser. Laser recording is done by melting spots in the gelatin matrix which contains the reflective surface which are later read as spots of low reflectivity.

The mirror-like reflective layer consists mainly of a relatively high volume concentration of non-filamentary silver particles and a lower concentration of filamentary silver particles supported in a matrix of gelatin. The dark underlayer consists mainly of a moderate volume concentration of filamentary silver particles supported in a matrix of gelatin. Other colloid matrices could be used to support the silver particles.

In brief, the two-layer medium is made as follows. The surface of a fine grained silver-halide emulsion photosensitive medium is exposed briefly to a low-to-moderate level of actinic radiation. This exposed silver-halide is then developed to an optical density typically 0.05 to 2.0, as measured with red light of a photographic densitometer. This gelatin layer containing filamentary silver particles exhibits an optical density of typically 0.05 to 0.8 for a 3 micron emulsion and 0.1 to 1.5 for a 6 micron emulsion. After this initial processing step, the emulsion layer is gray in appearance, but a large amount of the silver halide in the emulsion remains unaltered. A very thin layer of unexposed silver halide at the surface of this partially developed emulsion layer is then chemically fogged to form a very dense layer of silver precipitating nuclei at that surface. The fogged medium is finally subjected to a negative silver diffusion transfer step wherein the silver halide in the emulsion is solvated to form soluble silver complexes. These silver complexes are precipitated on the silver precipitating nuclei to form a reflective layer comprising non-filamentary silver particles which aggregate with the filamentary silver. The degree of reflectivity of the surface may be adjusted over a range of values depending upon the ratios of the two types of silver. This same mechanism also causes some of the silver ion complex to precipitate on the filamentary silver in the absorptive underlayer, increasing the optical density to red light of this already developed underlayer typically by at least a factor of two increase in light absorption.

The final result of these two exposure/development sequences is a superior reflective laser recording medium which is comprised of a very thin layer of reflective but non-electrically conducting reduced non-filamentary silver and a much smaller amount of filamentary silver, under which lies a highly absorptive layer consisting primarily of filamentary silver in a gelatin matrix. This absorptive underlayer typically has a final optical density to red light of between 0.2 and 3.0. The original silver-halide emulsion photosensitive medium which eventually results in the above described reflective laser recording medium is usually coated on either a plastic or glass substrate. The reflective surface has a reflectivity to green light of 44% for a typical sample.

Laser recording on this double-layer medium can be made very efficient. The absorptive filamentary silver particles in the reflective layer can be increased until the minimum acceptable reflectivity is reached. These filamentary particles are absorptive over a very wide spectrum range from ultraviolet to near infrared, permitting a wide variety of lasers to be used for recording. Also, the light energy that is not absorbed by the reflective layer is almost entirely absorbed by the underlayer which causes a rise of temperature at the interface of the reflective layer and underlayer, thereby facilitating the melting of the reflective layer. Recording is accomplished by use of a laser beam to melt the gelatin at a spot in the reflective layer, thereby reducing the reflectivity at the spot. Before recording, the reflectivity of the reflective layer is specular; in other words incident light perpendicular to the surface will be reflected back towards its origin in a parallel line. After recording, perpendicular incident light will be diffusely reflected because the light returning towards origin will be scattered as opposed to parallel. This latter effect and the increased absorptivity at the spot lead to a lowered reflectivity. The absorptive underlayer would be only slightly penetrated by the recording process. None of the silver in either layer is melted during the recording process.

Several distinct advantages result from this method of making reflective laser recording media. First, it is a very sensitive laser recording medium. Second, since the surface reflective layer retains its laser light absorptive and reflective properties over the visible and near-infrared wavelengths, it is a very broadband laser recording medium. Third, since different reflectivities of the surface may be achieved, pre-recordings may be produced using appropriate photomasks to create the desired exposure patterns. Fourth, the high recording sensitivity is achieved without resorting to a high-temperature heating process, thereby permitting the use of certain commercially available plastics as substrates. Fifth, the silver-halide emulsion of this invention is inexpensive owing to the thinness of the emulsion.

BRIEF DESCRIPTION OF THE DRAWNGS

FIG. 1 is a plan view illustrating a laser recording and data storage medium prepared in accordance with the method of the present invention.

FIG. 2 is a side sectional view illustrating a non-saturation exposure and gray development step for a photosensitive medium used in making a laser recording and data storage medium in accord with the present invention.

FIG. 3 is a side sectional view of the surface chemical fogging step to create nuclei on the photosensitive medium of FIG. 2 in accord with the method of the present invention.

FIG. 4 is a side sectional view of a negative diffusion transfer step from the emulsion layer to the nuclei on the photosensitive medium of FIG. 3 in accord with the method of the present invention.

FIG. 5 is a side sectional view illustrating a masking and exposure step of a photosensitive medium in an alternate method for making a laser recording and data storage medium of the present invention.

FIG. 6 is a side sectional view illustrating the second non-saturating exposure step and the gray development step in the alternate method first illustrated in FIG. 5.

FIG. 7 is a side sectional view illustrating the surface chemical fogging step to create nuclei in the alternate method for the photosensitive medium of FIGS. 5 and 6.

FIG. 8 is a side sectional view of a negative diffusion transfer step from the emulsion layer to the nuclei in the alternate method for the photosentitive medium of FIG. 7.

FIG. 9 is a side sectional view of the recording medium of FIG. 4 illustrating the method of laser recording.

DESCRIPTION OF THE PPREFERRED EMBODIMENT

A broadband reflective laser recording and data storage medium of the present invention is made in four principal steps: an initial exposure to actinic radiation, photographic development, surface chemical fogging or nucleation, and silver diffusion transfer. The finished medium may be a disk, as shown in FIG. 1, or may have other shapes.

A. Initial Exposure

The first step in the process of making the present invention is the exposure of the silver-halide photosensitive medium to actinic radiation. This initial exposure is non-saturating, leaving as much as two-thirds or more of the photosensitive silver halide unactivated. With reference to FIG. 2, the silver-halide photosensitive medium is preferably a fine grain silver halide photoplate, such as those used to produce semiconductor photomasks. The initial exposure may be obtained from a weak source or from a very brief exposure to a moderate source or actinic radiation. Actinic radiation is the generic term which describes any exposure which creates a latent image. Latent image is the term which describes activation of unexposed silver halide.

The initial exposure results in the formation of a latent image which when photographically developed produces a medium of gray color having an optical density of 0.05 to 2.0. This gray medium plays an important role in the performance of the broadband reflective laser recording medium of this invention. Clear gelatin absorbs very little light energy and thus a laser recording material using it will not be very sensitive. The present invention relates to the discovery that black filamentary silver particles may be formed to create a light absorptive medium while leaving a large portion of silver halide unactivated. This remaining silver halide then is used to create the reflective surface of the present invention.

Exposure of the silver-halide photosensitive medium may be of uniform intensity over the surface of the medium, as illustrated in FIG. 2. This would yield a uniform density of the latent images within the photosensitive medium, which when photographically developed results in a uniform gray tone or optical density throughout the medium.

An alternative to a uniform exposure and thus a uniform density of latent images is a patterned exposure of variable intensity, as illustrated in FIG. 5. For example, the exposure of the silver-halide photosensitive medium may be composed of alternating concentric bands of high and low intensity actinic radiation over the surface of the photosensitive medium. By changing the intensity of the exposure in an alternating fashion, by means of a shielding mask 14 having two degrees of transmissivity to the actinic radiation, the density of latent images within the photosensitive medium will differ in proportion to the intensity of the exposure levels. By patterning this differential exposure to form concentric or spiral bands of higher and lower density latent images, it is possible to create a light absorptive layer which may then be used by further processing to create a servo track pattern of two different reflectivities.

This initial gray layer becomes an absorptive underlayer in the final product, which is covered by a very thin layer of reflective reduced silver. The combination of a reflective silver coating over a light absorptive underlayer is in turn supported by a supporting substrate 19. This supporting substrate may be either glass or some plastic or ceramic material. It is not necessary that this supporting substrate be transparent to either the exposing actinic radiation or to the radiation produced by the optical reading device.

It is clear also that the combination of reflective silver coating over an absorptive underlayer may be placed on both sides of such a supporting substrate. For example, it is possible and practical to use a photoplate which has disposed on its opposite sides silver-halide photosensitive material. The fact that the photosensitive material which finally results in the silver coating over an absorptive substrate covers opposite sides of the supporting substrate has no detrimental effect on the utility of the final product and in fact provides twice the data storage capacity.

The silver-halide photosensitive medium hereinabove discussed may be a commercially available black and white photoplate or black and white film product such as a strip film with or without a gelatin overcoat. Photoplates used for semiconductor photomasks or holographic recordings have no overcoat. The smaller the grain sizes of the silver-halide emulsion the higher the resolution of recording of the final product which results from the application of this invention. The emulsion grain size should be less than 5% to 10% of the recording hole size for best results. As is shown in the examples which follow, commercially available high resolution silver-halide emulsion photoplates used in making semiconductor integrated circuits are particularly useful in the practice of this invention. These photoplates have grain sizes primarily under 0.05 micron and will yield non-filamentary silver particles for the high resolution reflective layer produced in the final process step. The silver halide in such plates is held in a colloid matrix, normally gelatin. But the invention is by no means limited to these photoplates nor indeed is it limited to using only commercially available silver-halide photosensitive materials. Any photosensitive silver-halide emulsion with grain sizes primarily under 0.05 micron may be used in the practice of the present invention for high resolution laser recording. For lower resolution recordings the silver halide grain sizes may be larger than 0.05 microns.

For purposes of this patent application, the term "silver-halide emulsion" means a silver-halide emulsion without a gelatin overcoat, unless an overcoat is specified.

It is clear that there are many different initial exposures which may be used in accordance with this invention. The two set forth herein, a uniform exposure and exposure through a mask having different transmissivities to actinic radiation are but two broad examples. Examples will suggest several different variations on this initial exposure step.

B. Photographic Development

The second step of the present invention is concerned with the photographic development of the latent images formed in the initial exposure. This produces a gelatin layer containing filamentary silver particles exhibiting a gray optical density as measured with red light of a photographic densitometer typically between 0.05 to 0.8 for a 3 micron thick emulsion and 0.1 to 1.5 for a 6 micron thick emulsion. This development creates a gray layer, on the surface of which will be formed a reflective layer. The gray layer becomes the absorptive underlayer, which in the recording/playback mode looks like a neutral density filter when the initial gray layer is at the higher range of optical densities and has a reddish hue when the initial gray layers are of lower optical density. The starting gray layer has an initial optical density typically of 0.05 to 2.0, as measured with red light, although for some applications a range of 0.1 to 0.8 may be preferred.

Referring to FIGS. 2, 3, 6 and 7, the black dots in photosensitive medium 11 illustrate the formation of filamentary silver as a result of development. The volume concentration of activated silver halide determines the volume concentration of filamentary silver. The volume concentration of filamentary silver in turn determines the optical density of the absorptive underlayer. The extent of development also affects the optical density.

When non-filamentary silver particles are distributed throughout the gelatin, light transmitted through the gelatin gives the appearance of a reddish color owing to the scattering effect of the tiny non-filamentary silver particles. When filamentary silver particles are distributed throughout the gelatin, light passing through the gelatin gives the appearance of a gray color, as in a neutral density filter. When both non-filamentary and filamentary silver particles are distributed throughout the gelatin, the color of the light passing through the gelatin can range from a reddish color to a neutral gray to a reddish gray, depending upon the concentrations of the two types of silver. The absorption created by the gray-appearing filamentary silver is very broadband from the visible through the near-infrared. Added to this absorptivity is that of the non-filamentary silver which adds to the absorptivity in the green and blue wavelengths but has a lesser effect at the red and infrared wavelengths.

Photographic development is the process of converting the activated silver halide which comprises the latent image into filamentary silver. The conversion is really a reduction of the activated silver to form a black filamentary silver. The development process is well known in the photographic industry. Generally, commercially available silver-halide photosensitive materials which may be used in accord with this invention have manufacturer suggested developing agents.

In addition to the relatively simple interplay between exposure time and development, we must consider the desired optical density of the absorptive underlayer formed by this development step. It must be remembered that the product produced by the disclosed invention is a broadband optical laser recording and data storage medium. As such, there are many possible applications of the product of this invention. The specifications of one user may not be the same as others, requiring flexibility in the sensitivity of the medium.

The principal role of the initial actinic exposure step is to create a latent image throughout the silver-halide emulsion layer which may be photographically developed into a gray layer created by filamentary silver particles in the gelatin matrix. No fixing step is used after the development since the remaining silver halide is used to create the desired reflective surface. The stronger the initial exposure and the stronger the development, the darker the gray color of the media and the less silver halide is left for creating the reflective layer. Thus, if a light shielding mask 14 is used to create a pattern of latent images and then if this is followed by a second moderate exposure, the developed plate will have areas of different gray densities. When such a media is processed to create a reflective surface, the reflectivity will vary in inverse relationship to the gray density of the media. Thus, the actinic exposure step can perform the valuable role of pre-patterning or prerecording the reflective laser recording media as well as creating the absorptive underlayer needed for efficient laser recording. The development step is designed to translate the patterned exposure into a patterned gray layer having areas of different gray densities.

The preferred initial optical density falls within a wide range for a number of reasons. For example, if a high surface reflectivity of 60% is required then the initial density would be under 0.5 since the higher the initial density the lower the final reflectivity. This high reflectivity may be required to achieve a high signal-to-noise ratio or ease of automatic focusing. Along these same lines, if two or more reflectivities are required for pre-recording servo-tracks or such, the high reflectivities would require lower initial gray densities.

As a second example, if a high recording sensitivity is desired, then the optical density of the underlayer should be higher than the minimum amount.

The third example involving the optical density is that it is not critical from a recording sensitivity standpoint. From a theoretical standpoint, an optical density of 1 indicates a 90% absorption of the laser beam and an optical density of 2 implies a 99% absorption. The exposure or processing difference to achieve these two optical densities would be great, but the effect on sensitivity would be small; that is, only about 10%.

The two purposes of the absorptive underlayer will be discussed below in Section E.

It is important to keep the unexposed and undeveloped silver halide in that condition between the photographic development step and the next step. For this reason, the development step and the surface chemical fogging step are performed in the absence of light or using a safe light, so as to keep the level of actinic radiation to a minimum. In addition, it is necessary to limit the exposure of the medium to actinic radiation in the transition from the initial exposure to the photographic development. This is obvious because a carefully controlled initial exposure would be ruined by exposure in transition to stray actinic radiation.

C. Surface Chemical Fogging

With reference to FIGS. 3 and 7, after the silver-halide photosensitive medium has been exposed and developed to an optical density of 0.05 to 2.0, the surface of the photosensitive medium is then fogged. Fogging, or nucleation, is the process of creating silver precipitating nuclei. These nuclei form a thin layer where the silver in silver ion complexes may be reduced to metallic silver and adsorbed. Essentially, all fogging does is to create an area where transported silver ion complexes may be aggregated and reduced to reflective silver. The nuclei formed by fogging are indicated by the + signs in FIGS. 3 and 7.

It is clear from the figures that the photosensitive medium 11 must be penetrated by the fogging agent to create a surface layer of nuclei. Generally, silver-halide photosensitve material utilize gelatin as a suspensive colloidal medium for the silver-halide emulsion. Thus, to form a layer of silver precipitating nuclei at the surface of the medium it is necessary to slightly penetrate the silver-halide emulsion. It is well known that when silver-halide emulsion absorbs water, the emulsion swells. This swelling results in a rapid and deep penetration of the fogging agent in any water based solution into the emulsion. This is not desirable since this would create a thick layer of nuclei which would result in a thicker, less reflective surface.

When a photoplate or other photosensitive medium without a gelatin overcoat is used, we find that the use of a water miscible alcohol, an example of which is methanol, almost entirely eliminates the swelling and thus minimizes the penetration of the fogging agent. This small penetration yields a thin and highly dense nuclei layer which, after the fogging step, becomes the desired thin highly reflective data recording medium. When the photosensitive medium contains a gelatin overcoat, also commonly called a supercoating, a water or alcohol based fogging solution is preferable in order for the fogging solution to penetrate the overcoat and create nuclei at the surface of the silver-halide emulsion.

Again, it must be kept in mind, that the purpose of this invention is to devise a method for making a reflective laser recording medium. The medium which results from this invention has a very thin reflective silver surface layer, preferably a small fraction of a micron, which covers a much thicker dark underlayer having an optical density of 0.2 to 3.0. This reflective silver surface is created by transporting silver ion complexes from the silver halide in the underlayer to the silver precipitating nuclei in the surface layer and then reducing the silver complexes formed at the nuclei to reflective non-filamentary silver particles. It is clear that the most efficacious location for the silver precipitating nuclei is at the surface of the silver-halide photosensitive medium.

It is desirable to limit the penetration of the fogging agent to as close to the surface of the photosensitive medium as is possible and practical. In this regard, methanol or any other water miscible alcohol is especially useful when the photosensitive medium used is a photoplate without an overcoat. However, any aqueous solution of a reducing agent will penetrate the gelatin of most commercially available photosensitive materials, thus creating a depthwise decreasing concentration of silver precipitating nuclei. Generally, fogging agents are used in a bath and penetrate the entire medium. However, in the method of the present invention selected solvents and time control the depth of penetration. It is important that the emulsion be uniform in dryness prior to emersion in the fogging agent in order to prevent varying degrees of penetration of the fogging agent.

The objective is to create a very thin, dense layer of nuclei. When there is no gelatin overcoat on top of the photographic emulsion, methanol is a very useful carrier of the fogging agent since it penetrates the gelatin much more slowly than water and, therefore, its penetration can be limited and controlled. When a gelatin overcoat is present, the fogging agent must be able to penetrate through the overcoat to reach the photosensitive silver halide without penetrating deeply into the silver-halide emulsion. Water or alcohol can be used for this purpose since they are effective in penetrating the overcoat.

A fogging agent is a very active reducing agent. Any one of the hundreds of photographic developers are reducing agents which could theoretically be made active enough to fog silver halide with the correct adjustments of concentration and pH. All would have some solubility in methanol, but it would be questionable if one could dissolve enough developer to be active while simultaneously dissolving enough antioxidant to protect the developer from air oxidation. Of the simpler compounds that would be active reducing agents and soluble in methanol, two examples are hydrazine and hydroxylamine. Both are fogging agents at high pH. However, both are silver-halide solvents that could partially dissolve the surface of the silver halide that is being fogged, which would be an undesirable effect. Borohydride is an example of a practical compound for the method of this invention, as it is very active in reducing silver halide, is not oxidized by air, and has no silver-halide solvent properties. Borohydrides of lithium, sodium, potassium, cesium and rubidium would be useful.

Consonant with the above limitation, depthwise penetration of the fogging agent is kept slight, typically less than 10% of the depth of the photosensitive medium. The competing factors of penetration and the duration of exposure to the fogging agent combine to determine the factors in the fogging step. By limiting depthwise penetration of the nucleation agent to typically five or ten percent of the depth of the emulsion, or one micron or less, the final reflective silver layer will occupy typically approximately the top five or ten percent of the medium and the gray underlayer will occupy the remaining ninety percent. Usually the photosensitive medium is less than 15 microns thick.

The chemical surface fogging or nucleation step may be eliminated by incorporating a thin layer of nucleating agent for silver precipitation. This is a common practice in silver diffusion transfer processes. In Chapter 16, "Diffusion Transfer and Monobaths," of *The Theory of the Photographic Proces,* Fourth Edition, T. H. James, a number of types of effective nucleating materials are mentioned which have been incorporated into a silver precipitating layer including copper, silver, silver sulfide, selenium, cadmium sulfide, lead sulfide, and mercuric sulfide. When a reflective surface is the objective rather than a black surface, it is important that round shaped crystals of silver are grown-not the filamentary type which leads to a black surface. Pure silver particles of a round-like shape would be preferred for this nucleating layer since sulfides tend to grow filamentary silver, which leads to a low reflectivity surface.

D. Silver Diffusion Transfer to Nuclei

After having formed a thin layer of silver precipitating nuclei on the surface of the silver-halide photosensitive medium, the final step of the method of the present invention entails transporting the silver in the remaining silver halide to the silver precipitating nuclei and by means of silver complexes there reducing the silver. This procedure is usually accomplished by placing the nucleated photosensitive medium in a monobath. This monobath contains both a silver-halide solvent and a silver reducing agent. This step is also done in the dark or using a safe light until silver diffusion transfer is complete.

The two elements of this monobath, a silver-halide solvent and a silver reducing agent, comprise a silver diffusion transport and reduction system. The silver-halide solvent acts on the silver halide in the photosensitive medium to produce mobile silver ion complexes. These free silver complexes are transported within the photosensitive medium to and through the surface of the medium. These silver complexes are then subjected to reduction, producing metallic silver on the silver nuclei and on the filamentary silver at the surface. This is represented by the clustered dots in the reflective layer 17 of FIGS. 4 and 8.

The reflective layer formed in this step is electrically non-conducting and has low thermal conductivity and may be patterned photographically, these latter two properties being highly desirable for laser recording media. The complexed silver ions are created by reaction of an appropriate silver solvent and the silver halide left undisturbed in the emulsion. A developing or reducing agent must be included in this solution to permit the complexed silver ions to be precipitated on the nuclei layer. This combination of developing agent and silver complexing solvent in one solution is called a monobath solution. Preferred monobath formulations for highly reflective surfaces include a developing agent which may be characterized as having low activity. The specific type of developing agent selected appears to be less critical than the activity level as determined by developer concentration and pH.

The developing agent should have a redox potential sufficient for causing silver ion reduction and adsorption or agglomeration on silver nuclei. The concentration of the developing agent and the pH of the monobath should not cause filamentary silver growth which gives a black low reflectivity appearance. The developed silver particles should have a geometric shape, such as a spherical or hexagonal shape which when concentrated form a good reflectivity surface.

Developing agents having the preferred characteristics are well known in the art and almost any photographic developing agent can be made to work by selection of concentration, pH and silver complexing agent, such that there is no chemical reaction between the developing agent and complexing agent. It is well known that photographic developing agents require an antioxidant to preserve them. The following are typical developing agent/antioxidant combinations which may be used in conjunction with a sodium thiocyanate (NaSCN) solvent) complexing agent.

| For Monobaths Using Na(SCN) As a Solvent And Silver Complexing Agent | |
|---|---|
| Developing Agent | Antioxidant |
| p-methylaminophenol | Ascorbic Acid |
| p-methylaminophenol | Sulfite |
| Ascorbic Acid | — |
| p-Phenylenediamine | Ascorbic Acid |
| Hydroquinone | Sulfite |
| Catechol | Sulfite |

The preferred solvents/silver complexing agents, which must be compatible with the developing agent, are mixed therewith, in proportions promoting the complete diffusion transfer process within reasonably short times, such as a few minutes. Such silver complexing agents in practical volume concentrations should be able to dissolve essentially all of the silver halide of a fine grain emulsion in just a few minutes. The solvent should not react with the developing silver grains to dissolve them or to form silver sulfide since this tends to create non-reflective silver. The solvent should be such that the specific rate of reduction of its silver complex at the silver nuclei layer is adequately fast even in the presence of developers of low activity, which are preferred to avoid the creation of low-reflectivity black filamentary silver in the initial development of the surface latent image.

The following chemicals act as silver-halide solvents and silver complexing agents in solution physical development. They are grouped approximately according to their rate of solution physical development; that is, the amount of silver deposited per unit time on precipitating nuclei, when used with a p-methylaminophenol-ascorbic acid developing agent.

Most Active

Thiocyanates (ammonium, potassium, sodium, etc.)
Thiosulphates (ammonium, potassium, sodium, etc)
Ammonium hydroxide

Moderately Active

α picolinium-β phenylethyl bromide
Ethylenediamine
2-Aminophenol furane
n-Butylamine
2-Aminophenol thiophene
Isopropylamine

Much Less Active

Hydroxylamine sulfate
Potassium chloride
Potassium bromide
Triethylamine
Sodium sulfite From the above it can be seen that the thiocyanates and ammonium hydroxide are amongst the most active solvents/complexing agents. While almost all developers suitable for solution physical development can be made to work in the silver diffusion transfer process of the present invention with the proper concentration and pH, not all solvents/complexing agents will work within the desired short development time or in the proper manner. For example, the thiosulfate salts, the most common silver-halide solvent used in photography and in Polaroid-Land black and white instant photography's diffusion transfer process, does not work in this process for two reasons. Its complexed silver ions are so stable that it requires a strong reducing agent to precipitate the silver on the nuclei, and this strong reducing or developing agent would have the undesirable effect of developing low reflective black filamentary silver. It has another undesirable effect, also exhibited by the solvent thiourea; namely, that it forms black, low reflecting silver sulfide with the developing silver grains. On the other hand in the black and white Polariod-Land process black silver is a desirable result. Sodium cyanide is not recommended, even though it is an excellent silver-halide solvent, because it is also an excellent solvent of metallic silver and would thus etch away the forming image. It is also about 50 times as toxic as sodium thiocyanate, which is a common photographic reagent.

In addition, if the solvent concentration is too low the solvent would not be able to convert the silver halide to a silver complex within a short process time and if the reducing agent is too weak the unexposed, undeveloped silver halide will bypass the silver precipitating nuclei causing much of the silver complex to go into solution rather than be precipitated. The process by which the silver complex is reduced at the silver precipitating nuclei and builds up the size of the nuclei is called solution physical development.

It is important to note that in solution physical development, as used herein, the silver particles do not grow as filamentary silver as in direct or chemical development, but instead grow roughly equally in all directions, resulting in a developed image composed of compact, rounded particles. As the particles grow, a transition to a hexagonal form is often observed. If the emulsion being developed has an extremely high density of silver nuclei to build upon and there is sufficient silver-halide material to be dissolved, then eventually the spheres will grow until some contact other spheres forming aggregates of several spheres or hexagons.

During the initial exposure and development steps, a gray layer is formed. The black filamentary silver which comprises the layer is present throughout the photosensitive medium. Thus the reflective layer formed in the final step, diffusion transfer, contains some filamentary silver. The filamentary silver is important in determining the absorptivity of the reflective layer. Typically, the volume concentration of silver in the reflective layer exceeds the average concentration in the underlayer by a ratio of at least 3 to 1. Usually, the volume concentration of silver particles in the reflective layer is a minimum of 20% and a maximum of 50%. Filamentary silver in the reflective layer may be as little as 1% and as much as 50% of the total silver in the reflective layer.

Also, in producing the gray layer as the second step in creating this broadband reflective recording media, recall that the initial optical density of this layer could fall anywhere within the range of 0.05 and 2.0. The optical density of the gray layer is raised by the silver diffusion transfer step which precipitates more silver on the filamentary silver of this layer, as shown by the dashes present in FIGS. 4, 8 and 9, raising its density to between perhaps 0.2 and 3.0 in the finished product. For most applications, however, the initial density would still fall within the range of about 0.1 to 0.8 optical density. All of the above optical densities are measured with red light.

In the second set of figures, numbers 5 through 8, a mask is used in the initial exposure, thereby creating areas of greater and lesser optical density upon development. In the final step of this invention, a reflective layer of differing reflectivities, 17a and 17b, is formed by negative diffusion transfer.

In FIG. 5, the photosensitive medium 11 is exposed through mask 14 to a non-saturating level of actinic radiation from source 13. Mask 14 has a transmissive area 14b and an absorptive area 14a which creates a pattern at the surface of the photosensitive medium of two different intensities of actinic radiation. Next, in FIG. 6, the mask has been removed and the same photosensitive medium 11 is exposed to a uniform level of actinic radiation. The cumulative effect of these successive exposures is to form a latent image of at least two differing densities while activating less than half of the photosensitive silver halide present in the photosensitive medium. In this example, the density of filamentary silver formed during development in area 11a is less than that in area 11b. FIG. 7 shows the formation by surface chemical fogging of a thin layer of silver precipitating nuclei. In FIG. 8 a reflective layer is formed by negative diffusion transfer as discussed immediately above.

The reflective layer in FIG. 8 has two different reflectivities, shown by 17a and 17b. The reflectivity of 17a is greater than that of 17b for two distinct reasons. First, area 11a contains a larger concentration of unexposed undeveloped silver halide than does 11b. Thus there are more immediately available silver ion complexes in 11a when the photosensitive medium is exposed to the monobath. Since the concentration of silver precipitating nuclei is areawise constant, the only relevant factor in formation of reflective silver is the availability of silver ion complexes. Thus since more complexes are available in 11a than in 11b, more silver will aggregate and subsequently be reduced in 17a than in 17b.

Second, as will be recalled from the section on photographic development, filamentary silver is present throughout the developed photosensitive medium. In FIGS. 6, 7 and 8 the density of filamentary silver in 11b is greater than in 11a. The concentration of filamentary silver particles is present in the reflective layer in essentially the same concentration or density as it is in the rest of the photosensitve medium immediately below the reflective layer. Thus the amount of filamentary silver present in reflective layer 17a is less than that in 17b and as you would expect the resulting reflectivity in 17b is reduced in comparison to 17a, owing to the higher absorptivity of the filamentary particles in 17b. It should be remembered that the quantity of reflective silver present in the reflective layer is substantially greater than the amount of absorptive filamentary silver, but where the density of filamentary silver varies in an areawise fashion its incorporation into the reflective layer does have an impact on local reflectivity. The result of the silver diffusion transport and reduction step is a very thin layer of reflective silver particles over an absorptive underlayer. This very thin reflective layer is easily distorted, melted or punctured by a laser and thus is suitable for laser recording. Reflectivity between 10% to 75% can be attained. The normally high thermal and electrical conductivity of silver is not present since the silver particles are not in contact. Both layers are non-conductive electrically. Another disadvantage of the use of silver is its cost. In this invention, however, very little silver is used both to form the reflective silver coating on the opaque substrate or underlayer and there is very little silver to begin with in the silver-halide photosensitive medium. Thus this invention has the advantages of being inexpensive and using commercially available materials as well as being amenable to well known photochemistry.

E. Laser Recording

Referring now to FIG. 9, there is an illustration of recording on the broadband reflective laser recording medium of this invention. Reflective layer 17 has been pitted by a laser beam forming a shallow crater 23 which is a hole in the reflective layer. It is important to notice that the penetration of the laser beam is very shallow, barely penetrating the reflective layer. The reflective gelatin matrix which incorporates the reflective silver is melted, causing a loss of reflectivity where the melting occurs.

Before recording, the reflectivity of the reflective layer is specular; in other words, incident light perpendicular to the surface will be reflected back towards its origin in a parallel line. After recording, light which is perpendicularly incident on a crater or pit will be diffusely reflected becuse the light returning towards the source will be scattered as opposed to parallel. This latter effect and the increased absorptivity of the spot lead to a lowered reflectivity.

Crater 23 may be 1 micron in diameter or less, though for some purposes a larger crater may be desired. For example, in analog recording ovals of more than one micron length are sometimes used.

When laser recording is being done the higher the absorptivity of the surface the easier it is to melt craters which appear to be holes in the surface. However if the reflected light is being used for reading the recorded data or for automatic focusing then a high reflectivity is desired. The incorporation of various amounts of filamentary silver with the non-filamentary silver of the reflective layers offers an important means of adjusting the reflectivity to the desired level. Also the filamentary silver particles are absorptive even at near infrared wavelengths which results in these media being a broadband laser recording media.

The absorptive underlayer, 21, which is the result of the exposure and development steps, serves two purposes in laser recording. First, the filamentary silver absorbs the light energy of the recording laser beam, converting it into heat. The reflective layer of this invention is partially transmissive, especially in the near infrared where semiconductor lasers operate. Thus transmitted light energy through the reflective layer is absorbed by the absorptive underlayer immediately beneath the reflective surface it strikes. The light energy is converted into heat, causing a temperature rise in the underlayer and the reflective layer in contact with it. This in turn makes it easier to melt the reflective layer by raising its temperature. The conversion of light energy into heat by the filamentary silver has a synergistic effect in the recording mode, because as the temperature of the reflective layer increases the temperature rise necessary to reach the melting point of the reflective gelatin matrix decreases. A similar effect may be achieved by adding to the emulsion materials absorptive at the wavelength of the recording laser, for example, by dyeing the gelatin.

Second, gelatin is a good thermal insulator. Thin metal layers such as tellurium used for laser recording have a higher degree of thermal conductivity than does the gelatin layer containing either the reflective or filamentary silver. Thus heat dissipated in the reflective layer does not flow rapidly into the substrate thus heat energy is conserved and the recording process is efficient. The broadband laser recording and data storage medium of this invention has the advantage of metal-like reflectivity while avoiding the disadvantages of high thermal conductivity and high melting temperature concomitant with the use of a metal film. Also, gelatin melts at a temperature of about 350° C. compared to 450° C. for tellurium, the most common laser recording material used today.

EXAMPLE 1

This example illustrates how the level of the initial light exposure is related to the final reflectivity of the surface layer. If the first exposure is intense, then the emulsion photoplate will develop dark gray to black, leaving no silver halide to produce the reflective layer. For the same reasons, a slight initial exposure will result in a final highly reflective surface. To illustrate this point, a commercial Agfa-Gevaert Millimask HD emulsion, 4.5 microns thick, containing a screening dye, was exposed on a Mark VII sensitometer manufactured by Edgerton, Germeshausen & Grier, Inc. The plate was placed emulsion-side down and exposed with the instrument's tungsten light source through a stepped wedge stepped in optical density units of 0.1. The photoplate was exposed for $10^{-2}$ sec. through the stepped wedge. The photoplate was developed for 4 minutes in a developer with the following formulation: sodium sulfite, 36.9 grams; hydroquinone, 7.9 grams; phenidone, 0.52 gram; potassium hydroxide, 7.4 grams; potassium bromide, 2.7 grams; benzotriazole, 0.07 gram; with water added to bring volume up to 1 liter.

After development, washing, and drying, the resulting neutral optical density was measured with red light on a Macbeth densitometer Model TR527. The optical densities were as follows:

| Step Number | Initial Optical Density (with Red Light) |
|---|---|
| 6 | 5.80 |
| 7 | 4.26 |
| 8 | 2.69 |
| 9 | 1.40 |
| 10 | 0.65 |
| 11 | 0.31 |
| No initial exposure | 0.0 |

A similar plate was processed as described previously and was immersed in a surface fogging solution of 0.5 grams per liter $KBH_4$ and 0.5 grams per liter NaOH in methanol for 15 seconds to create silver nuclei on the surface. This nucleated plate was then washed for 1 minute and placed in a monobath developer solution containing: sodium sulfite, 10 grams; ascorbic acid, 2.5 grams; Elon (Kodak developer), 0.25 gram; sodium hydroxide, 2.0 grams; sodium thiocyanate, 125 grams; with water added to bring volume up to 1 liter. After immersion for 2 minutes in the monobath, the photoplate was analyzed for reflectivity and optical density. The resulting optical densities were measured with a Macbeth densitometer Model TR 527, and the reflectivities were measured with a system comprised of a He-Ne laser and an International Light, Inc. Model IL 710A research photometer. The 633-nanometer light reflected from the sample was compared to an aluminum mirror of 92% reflectance. The results were as follows:

| Step Number | Final Optical Density (with Red Light) | Reflectivity |
|---|---|---|
| 6 | 5.85 | 9.8% |
| 7 | 5.84 | 10.3% |
| 8 | 4.97 | 10.2% |
| 9 | 3.15 | 18.0% |
| 10 | 1.97 | 35.0% |
| 11 | 1.32 | 38.5% |
| No initial exposure | 0.88 | 45.8% |

This example shows that by changing the initial exposure level as done above by use of a stepped wedge as a mask, it is possible to make an optical data storage medium with areas of reduced reflectivity where higher actinic exposure occurred and areas of higher reflectivity where lower intensity actinic exposure occurred.

EXAMPLE 2

The first part of this example illustrates that only a low initial actinic exposure is necessary to create the desired amount of filamentary-type silver in the surface layer and underlayer. The volume concentration of the filamentary silver in the finished media is determined by two effects. The first is the initial exposure and development, and the second is the immersion of the photoplate in the monobath. The first effect creates a given number of filamentary silver particles, while the second effect results in an intensification by the build-up of the filaments by the metallic deposit of silver from the silver complex created when the monobath interacts with the silver halide.

A photoplate coated with a commercial Konishiroku ST emulsion, 3 microns thick, with an anti-halation backing and containing no screening dye, was exposed on a Mark VII sensitometer manufactured by Edgerton, Germeshausen & Grier, Inc. The photoplate was placed emulsion-side down and exposed with the instrument's tungsten light source through a stepped wedge stepped in optical density units of 0.1. Actinic radiation exposure was $2 \times 10^{-4}$ seconds. The exposed photoplate was then developed for 4 minutes and not fixed. The anti-halation backing is removed in this process. The developer formulation was as follows: sodium sulfite, 36.9 grams; hydroquinone, 7.9 grams; phenidone, 0.52 gram; potassium hydroxide, 7.4 grams; potassium bromide, 2.7 grams; benzotriazole, 0.07 gram; with water added to bring volume up to 1 liter.

After washing and drying, the resulting neutral optical densities were measured in red light on a Macbeth densitometer, Model TR 527. Each step of the stepped wedge is defined by a number. The step identification and associated optical density is presented in the two columns on the left:

| Step Number | Optical Density (with Red Light) After Initial Exposure and Development | Optical Density (with Red Light) Following Initial Exposure, Development, and Immersion in Monobath |
|---|---|---|
| 4 | 1.05 | 3.03 |
| 5 | .93 | 3.00 |
| 6 | .77 | 2.91 |
| 7 | .66 | 2.75 |
| 8 | .54 | 2.53 |
| 9 | .39 | 2.13 |
| 10 | .20 | 1.45 |
| 11 | .10 | 1.15 |
| 12 | .05 | 1.30 |

This exposed and developed stepped wedge was then immersed for 3 minutes in a monobath solution comprising: sodium sulfite, 10 grams; ascorbic acid, 2.5 grams; Elon (Kodak developer), 0.25 gram; sodium hydroxide, 2.0 grams; sodium thiocyanate, 60 grams; with water added to bring volume up to 1 liter. Note the substantial rise in optical density compared to the initial optical density.

The second part of this example illustrates how the initial gray density is related to the final reflectivity for the Konishiroku photoplate coated with an ST emulsion 3 microns thick. A second sample was exposed and developed by the identical procedure described above.

However, before inserting the sample into the monobath solution for 3 minutes, it was thoroughly dried, then immersed for 15 seconds in a fogging solution comprising: $KBH_4$, 0.15 gram; and $NaOCH_3$, 0.6 gram with methanol added to bring volume up to one liter. The photoplate was then washing thoroughly before and after immersion in the monobath.

The reflectivities were then measured for the more reflective step numbers at 633 nanometers using a DR2J microreflectometer system manufactured by Gamma Scientific Inc. The results were as follows:

| Step Number | Reflectivity Measured at 633 Nanometers |
| --- | --- |
| 8 | 7.8% |
| 9 | 21.8% |
| 10 | 48.4% |
| 11 | 63.1% |
| 12 | 66% |

Thus, we see that step 10 had an initial absorptivity of 0.20 and a final reflectivity of 48% at 633 nanometers. For higher initial absorptivity, the final reflectivity was lower and vice versa.

EXAMPLE 3

This example illustrates that the reflective laser recording made by the method of this invention permits recording at lower laser powers than any of the previous media described by the same inventors in earlier patent applications, and also that this high sensitivity is achieved in conjunction with a reflectivity of at least 44% which is considerably higher than that obtained earlier. Also, the reflectivity remains at a relatively high level into the near infrared.

A 3-inch square photoplate coated with a commercial Konishiroku ST emulsion 3 microns thick and containing no screening dye, was exposed for 1.0 second at 3580 nanoamps/cm$^2$ on an Ultratech contact printer, Model CP210. This is approximately equivalent to 10 lumens/ft.$^2$ for 1.0 second. It was then developed in a developer solution for 5 minutes and not fixed. The developer was comprised of: sodium sulfite, 36.9 grams; hydroquinone, 7.9 grams; potassium hydroxide, 7.4 grams; potassium bromide, 2.7 grams; benzotriazole, 0.7 gram; with water added to bring volume up to 1 liter. The photoplate was then washed in water for 10 minutes. Next, the photoplate was oven dried at 40° C. for 20 minutes. The photoplate was then dipped for 15 seconds in a solution of $KBH_4$, 0.15 gram; and $NaOCH_3$, 0.6 gram; with methanol added to bring volume up to one liter. The photoplate was then washed in water for 10 minutes and not dried. To achieve silver diffusion transfer, the photoplate was then immersed for 3 minutes in a monobath developer solution comprising: sodium sulfite, 10 grams; ascorbic acid, 2.5 grams; Elon (Kodak developer), 0.25 gram; sodium hydroxide, 2.0 grams; sodium thiocyanate, 60 grams; with water added to bring volume up to 1 liter. The final wash in water was for 10 minutes, followed by an air oven drying for 20 minutes at 40° C.

The resulting mirror-like coating on the glass substrate is a broadband reflective laser recording and data storage medium. Laser recording was accomplished with an argon laser using the green line at 514 nanometers. The laser beam diameter was approximately 0.8 micron at the surface of the medium, and pulse lengths of 100 nanoseconds were used. Tests were conducted to record low reflectivity spots with the laser beam by melting the reflective surface of the gelatin. Then the reflectivity of the hole was compared to the reflectivity of an adjacent area. A comparison of these reflectivities leads to a relative contrast ratio measurement. This procedure was repeated for 60 holes at a given laser power level. (The samples of the prior art were tested with 32 holes.) The relative contrast ratio was determined by averaging results from the 60 holes. Also calculated was the statistical distribution of the relative contrast ratio for the 60 holes and a ±1 sigma distribution was calculated. These resulting data are presented as Sample 4 on Table 1. For comparison with performance of prior art media, the performances of samples 1, 2 and 3, also shown on Table 1, are presented as milestones of the prior art. Note that for all media, the relative contrast ratio declines with the reduction of laser power. It should be understood that as the laser power declines near the lower levels, the recorded hole gets smaller and smaller. Thus, when the 0.8-micron laser beam is directed at, say, a 0.6-micron hole, some light is reflected back from the undisturbed reflective area around the hole. This is important to understand in evaluating the data contained in Table 1.

Also, acceptable recordings may be defined as those which give the smallest ±1 sigma distribution as a percentage of the average relative contrast ratio. Thus we see that for prior art sample 2, the material is unusable at 2.8 milliwatts since the distribution of ±834 is actually larger than the relative contrast of 640. If we were to set an arbitrary recording sensitivity limit at the power level where, say, the sigma distribution is no more than 20% of the relative contrast ratio, we could arrive at a means of comparing laser recording sensitivities of the three prior art samples 1, 2 and 3 to that of sample 4. By this definition, sample 1 would have a minimum power requirement of about 2.2 milliwatts, sample 2 would have a minimum power requirement of more than 15.4 milliwatts; sample 3 would have a minimum power requirement of 1.7 milliwatts; and sample 4, using the method of the present invention, would have a minimum power requirement of 1 milliwatt; thus, it is the most sensitive of the group.

In addition, sample 4 has a reflectivity of at least 44%, which compares to 17%, 21% and 25.5%, respectively, for samples 1, 2 and 3. This is important whenever the reflected signal is used as in automatic focusing and in maximizing the signal-to-noise ratio. The reflectivity of sample 4, produced by the method of the present invention, maintains adequate reflectivity over a significant range. The reflectivities of this sample were measured with a DR2J microreflectometer system manufactured by Gamma Scientific Inc.

| Reflectivity Data: Sample 4 | | |
| --- | --- | --- |
| Wavelength | Reflectivity | Light Source |
| 514 nm | 50% | Spectral reflectometer |
| 514 nm | 44% | 0.8-micron laser beam |
| 633 nm | 60% | Spectral reflectometer |
| 633 nm | 62% | HeNe laser |
| 830 nm | 36% | Spectral reflectometer |

The light absorptivity of several samples were compared to determine whether sample 4 is more broadband in absorptivity. Since sample 2 has a much lower recording sensitivity than the others, it was left out of the comparison. For visible measurements, a Macbeth densitometer, Model TR 527 was used; and for the near infrared absorptivity measurements, a Beckman DK-2 spectrophotometer was used. The results were as follows:

| Wavelength or Color | Optical Densities | | |
|---|---|---|---|
| | Prior Art | | Present Invention |
| | Sample 1 | Sample 3 | Sample 4 |
| Blue | 4.65 | 4.8 | 3.44 |
| Green | 3.89 | 4.25 | 2.77 |
| Red | 1.36 | 2.83 | 1.92 |
| 780 nm | 1.04 | 1.11 | 1.77 |
| 830 nm | 1.04 | 1.05 | 1.51 |
| 900 nm | 1.03 | 1.04 | 1.51 |

The absorptivity characteristics of sample 4 are clearly more broadband; that is, more uniform over the spectral area of interest. Over the spectrum shown, the optical densities of samples 1 and 3 vary by about a factor of 4 compared to a factor of 2 for sample 4. Also, the optical density in the near infrared is considerably higher for sample 4 than samples 1 and 3, making it more suitable for recording with a near infrared semiconductor diode laser, which typically operates at 780 nanometers and 830 nanometers.

What is claimed is:

1. A reflective data recording medium comprising,
   a colloid matrix underlayer disposed on a substrate, said underlayer having primarily filamentary silver particles therein characterized by an optical density to red light between 0.2 and 3.0, and absorptive of visible and infrared light, and
   a reflective surface layer primarily of non-filamentary individual silver particles in said colloid matrix, said reflective surface layer disposed atop said underlayer, having maximum silver particle dimensions primarily under 0.05 microns, some of which are aggregated with similar particles, and having a volume concentration of silver particles greater in said surface layer than in said colloid matrix underlayer, said reflective surface layer having at least one area having substantially uniform reflectivity, said uniform reflectivity being between 10% and 75%.

2. The data recording medium of claim 1 wherein the volume concentration of silver in said reflective surface layer exceeds the lowest silver volume concentration within said colloid matrix underlayer by a ratio of at least 3:1.

TABLE 1

THE BEST TEST RESULTS ACHIEVED FROM DIFFERENT LASER RECORDING MEDIA SAMPLES MANUFACTURED BY METHODS OF DIFFERENT PATENT APPLICATIONS
Common Test Conditions - Laser wavelength, 514 nm; beam diameter, 0.8 micron
Pulse length, 100 nanoseconds; automatic beam focus

| Sample | Pulsed Power at Surface of Recording Medium (in Milliwatts) | Average Relative Contrast Ratio | Statistical Distribution of Contrast Ratios (±1 Sigma) |
|---|---|---|---|
| SAMPLE 1: Made by Method of U.S. Pat. | 10.4 | 2634 | ±270 |
| Application Ser. No. 012,235 | 8.7 | 2651 | ±325 |
| | 6.9 | 2498 | ±336 |
| | 5.7 | 2221 | ±459 |
| Reflectivity at 514 nm = 17% | 4.6 | 2156 | ±432 |
| | 3.6 | 1860 | ±624 |
| | 2.8 | 1725 | ±380 |
| | 2.2 | 1217 | ±250 |
| | 1.7 | 654 | ±188 |
| | 1.3 | 279 | ±145 |
| SAMPLE 2: Made by Method of U.S. Pat. | 15.4 | 2394 | ±723 |
| Application Ser. No. 055,270 | 12.8 | 1575 | ±758 |
| | 10.4 | 1640 | ±1000 |
| | 8.7 | 1736 | ±850 |
| Reflectivity at 514 nm = 21% | 6.9 | 1540 | ±732 |
| | 5.7 | 1401 | ±840 |
| | 4.6 | 1094 | ±846 |
| | 3.6 | 1148 | ±762 |
| | 2.8 | 640 | ±834 |
| SAMPLE 3: Made by Method of U.S. Pat. | 10.4 | 2970 | ±228 |
| Application Ser. No. 072,908 | 8.7 | — | — |
| | 6.9 | 2814 | ±220 |
| Reflectivity at 514 nm = 25.5% | 5.7 | 2660 | ±234 |
| | 4.6 | 2560 | ±218 |
| | 3.6 | 2270 | ±200 |
| | 2.8 | 1936 | ±196 |
| | 2.2 | 1454 | ±206 |
| | 1.7 | 950 | ±192 |
| | 1.3 | 538 | ±162 |
| | 1.1 | 198 | ±116 |
| SAMPLE 4: Made by Method of this Invention | 10.3 | 2347 | ±83 |
| | 8.1 | 2281 | ±83 |
| Reflectivity at 514 nm = 44% | 6.7 | 2212 | ±104 |
| | 5.4 | 1992 | ±104 |
| | 4.2 | 1701 | ±154 |
| | 3.3 | 1391 | ±135 |
| | 2.6 | 1101 | ±140 |
| | 2.0 | 815 | ±96 |
| | 1.5 | 651 | ±68 |
| | 1.25 | 485 | ±70 |
| | 0.96 | 265 | ±55 |

3. The data recording medium of claim 1 wherein said reflective surface layer is less than one micron thick.

4. The data recording medium of claim 1 wherein said volume concentration of silver particles in said reflective layer is a minimum of 20% and a maximum of 50%.

5. The data recording medium of claim 1 wherein said colloid matrix layer is photographic gelatin of the type used in the manufacture of silver-halide emulsions.

6. The data recording medium of claim 1 wherein said reflective surface layer comprises primarily non-filamentary silver particles and at least 1% filamentary silver particles of the total silver volume concentration in said reflective layer.

7. The data recording medium of claim 1 wherein the thickness of the colloid matrix layer is less than 15 microns.

8. A data recording medium of claim 1 wherein said reflective surface layer is electrically non-conductive.

* * * * *